United States Patent
Jin et al.

(10) Patent No.: US 6,403,233 B1
(45) Date of Patent: Jun. 11, 2002

(54) ARTICLE COMPRISING CREEP-RESISTANT AND STRESS-REDUCING SOLDER

(75) Inventors: Sungho Jin, Millington; Guenther Wilhelm Kammlott, Watchung; Hareesh Mavoori, Piscataway, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/548,574

(22) Filed: Apr. 13, 2000

(51) Int. Cl.[7] .................. B23K 35/24; B23K 31/02; B32B 15/14; C22C 5/02
(52) U.S. Cl. .................. 428/672; 420/507; 228/121
(58) Field of Search .................. 428/672; 420/507; 228/121

(56) References Cited

U.S. PATENT DOCUMENTS 3,472,653 A  10/1969  Short .................. 75/165

FOREIGN PATENT DOCUMENTS

GB     894622      4/1962
GB   2 225 267 A   5/1990  ............ B23K/1/19

OTHER PUBLICATIONS

Dain Stedman Evans et al., *The Reaction of 80 wt.% Au–20 wt.% Sn Solder Alloy with Gallium*, Zeitschrift Fur Metallkunde, vol. 87, No. 8, Aug. 1996, pp. 626–628.
R. E. Thompson, et al., "Polarization maintaining single-mode fibers", IOOC '81, Third International Conference on Integrated Optics and Optical Fiber Communication *Technical Digest*, p. 60 (1981).
H. Hosokawa et al., "Integrated Optic Microdisplacement Sensor Using a Y–Junction and a Polarization Maintaining Fiber", *Technical Digest*, Optical Fiber Sensors Topical Meeting, Optical Society of America, p. 137 (1988).

*Primary Examiner*—Deborah Jones
*Assistant Examiner*—Jason Savage
(74) *Attorney, Agent, or Firm*—Scott J. Rittman

(57) ABSTRACT

The invention relates to use of a solder composition exhibiting a desired combination of high creep resistance at typical operating temperatures and low stress in formed solder joints. The invention uses a solder containing 82 to 85 wt. % Au, 12 to 14 wt. % Sn, and 3 to 4 wt. % Ga (optionally with up to 2 wt. % additional elements). The small amount of added Ga induces a significant depression in the liquidus temperatures of both Au and Sn, and thus a depressed melting point (about 27° C. less than eutectic Au—Sn solder), and also provides an enhanced temperature-sensitivity of the solder's creep resistance.

15 Claims, 8 Drawing Sheets

*FIG.* 6A
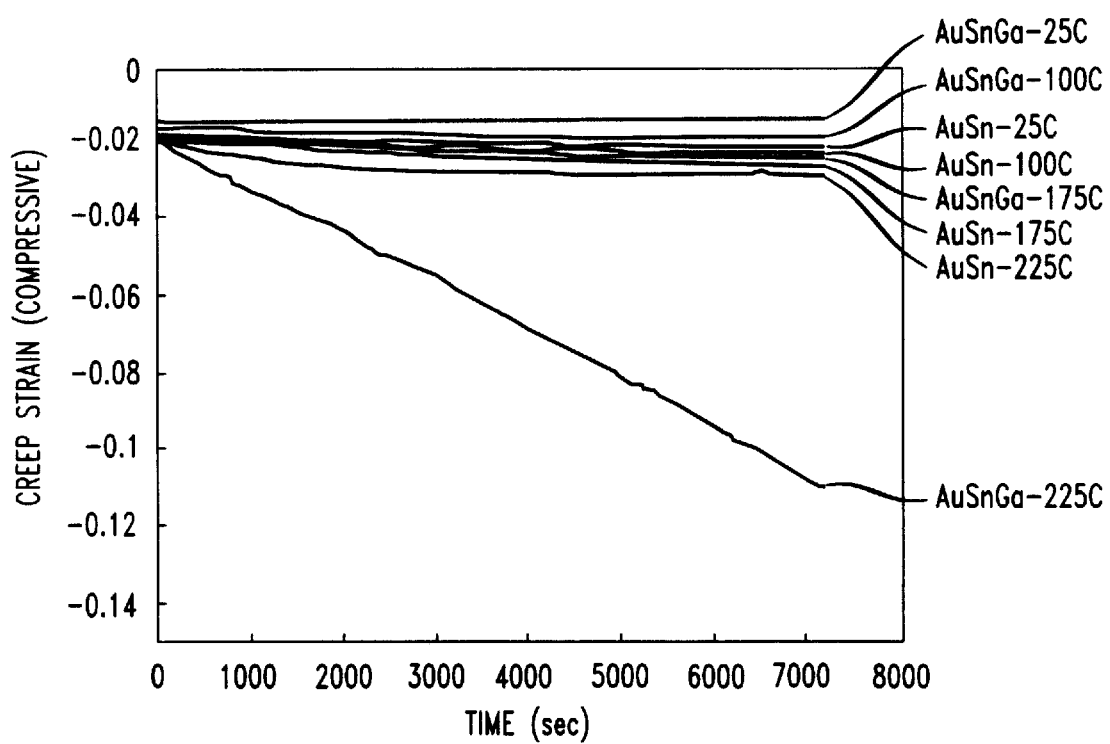

ARTICLE COMPRISING CREEP-RESISTANT AND STRESS-REDUCING SOLDER

BACKGROUND OF THE INVENTION

1. Field of the Invention

The invention relates to solder compositions, in particular solder compositions useful in precision optical and opto-electronic applications.

2. Discussion of the Related Art

One of the challenges for optical and opto-electronic packaging is to connect components with precise alignment, and to maintain the stability of the alignment during device operation, i.e., through fluctuations in the ambient temperature and stress conditions at the interconnect. In addition, where the components are highly stress-sensitive, it is desirable to reduce stresses in the solder joint.

For example, precision coupling is necessary between optical fibers or waveguides and optically active devices such as lasers, light-emitting diodes, or photodetectors. Such coupling is often accomplished by active alignment, e.g., by monitoring the coupling efficiency between a fiber and a laser, adjusting the position of the fiber and laser to reach the desired efficiency, and then proceeding with a permanent assembly procedure such as soldering, brazing, or adhesive bonding. Because active alignment is inefficient and costly, passive alignment techniques, which use, for example, solder self-alignment alignment or fixtures such as v-grooves, are often more desirable. In both alignment schemes, but particularly passive alignment, the dimensional stability of the alignment is crucial. Creep deformation of solder joints will lead to a permanent shift of the optical alignment between the mating devices, causing deterioration of optical efficiencies. Thus, solder joints for such optical applications are desirably formed from solder having high creep resistance.

However, highly creep resistant solders generally exhibit relatively high stresses. Specifically, such solders tend to lock in stresses created during solder joint formation, e.g., due to thermal expansion mismatches between the solder and the components being joined, or induced by external mechanical force. Such high stresses are not compatible with some optical applications. For example, polarization maintaining fiber (PMF) is currently of interest due to its ability to enhance the performance of various optical communication systems and sensor devices. Polarization maintenance in PMF is achieved by constructing the optical fiber such that the two orthogonal components of the fundamental mode experience different propagation constants, either by inducing birefringence of the fiber material or by introducing geometrical ellipticity in the fiber core. (See, e.g., R. E. Thompson and F. I. Akers, "Polarization maintaining single-mode fibers", IOOC '81, Third International Conference on Integrated Optics and Optical Fiber Communication Technical Digest, 1981, p.60.) These construction techniques make PMF highly sensitive to stresses exerted on the fiber, in that stresses are able to affect both the birefringence profile and the geometrical ellipticity. Therefore, bonding of PMF to active devices requires solder joints that are not only creep-resistant—to maintain alignment, but also exhibit low stresses on the PMF. Unfortunately, as noted above, the properties of low stress and high creep resistance tend to be mutually exclusive, in that highly creep-resistant solders tend to be non-ductile and thus hold in stresses, while lower-stress solders tend to have higher ductility and thus lower creep resistance.

For these reasons, it would be desirable to have solders more suitable for optical and opto-electronic applications, i.e., solders that exhibit a combination of high creep resistance but also relatively low induced stress. Current solders do not meet these requirements. Specifically, typical microelectronic solder such as the 37Pb—63Sn eutectic solder has a relatively low melting temperature of about 183° C. Under the usual temperature cycling, and in the presence of stresses in the solder joints (from thermal expansion mismatches or from mechanical force), creep deformation of such Pb—Sn solder is unavoidable, and the associated degradation in optical alignment is typically unacceptable.

The opposite problem is encountered with Au—Sn solders. Because higher melting point solders generally have higher creep resistance, solder based on the Au—Sn system (melting point of 280° C. at a eutectic composition of 80 wt. % Au—20 wt. % Sn) is conventionally used for most opto-electronic applications, and is, in fact, one of the most creep-resistant solders known. However, as shown in the Au—Sn phase diagram of FIG. 1, the 80 wt. % Au—20 wt. % Sn composition corresponds to a eutectic between two intermetallic phases—$Au_5Sn$ and AuSn, and is therefore relatively hard and brittle. This lack of ductility tends to create a significant amount of stress in the solder joints, particularly during the cooling from the relatively high soldering temperature (typically 300–310° C.). Thus, while such a Au—Sn solder exhibits desirable creep resistance, its stress-related properties make it undesirable for bonding stress-sensitive components such as PMF. In addition, the high melting point increases the difficulty of the bonding and assembly steps.

Thus, there remains a need for relatively low melting temperature solders which exhibit relatively high creep resistance at operating temperatures—to maintain the stability of an opto-electronic assembly, yet exhibit relatively low stresses in the solder joints.

SUMMARY OF THE INVENTION

The invention relates to use of a solder composition exhibiting a desired combination of high creep resistance at typical operating temperatures and low stress in formed solder joints. The invention uses a solder containing 82 to 85 wt. % Au, 12 to 14 wt. % Sn, and 3 to 4 wt. % Ga (optionally with up to 2 wt. % additional elements). Ga exhibits unique properties such as low melting point (29.76° C.), low vapor pressure even at high temperatures, and high resistance to attack by acids. These characteristics allow a small amount of added Ga to induce a significant depression in the liquidus temperatures of both Au and Sn (see FIGS. 2A and 2B), and thus a depressed melting point (at least 10° C. less, typically about 27° C. less, than eutectic Au—Sn solder). The Ga also provides enhanced temperature-sensitivity of the solder's creep resistance.

The Ga-containing solder meets the conflicting demands of high creep-resistance and stress-relaxation of solder joints in the following manner. At typical operating temperatures, generally below a temperature of 170 to 230° C., the Au—Sn—Ga solder exhibits higher creep resistance, relative to 80wt. % Au—20wt. % Sn. This high creep resistance thereby maintains desirable component alignment under typical operating conditions. However, at higher temperatures at which reflow and initial cooling from reflow occur, the solder exhibits lower creep resistance compared to 80 wt. % Au—20 wt. % Sn, this lower creep resistance allowing for relaxation of stresses during cooling from reflow. The resultant solder joint thereby encounters less stresses in use, but is able to sufficiently maintain the alignment of optical components under operating temperatures.

BRIEF DESCRIPTION OF THE DRAWINGS

FIGS. 6A and 6B show comparative compressive creep curves for Au—Sn—Ga solder of the invention and eutectic Au—Sn solder, at two different creep scales.

DETAILED DESCRIPTION OF THE INVENTION

Figure 1:
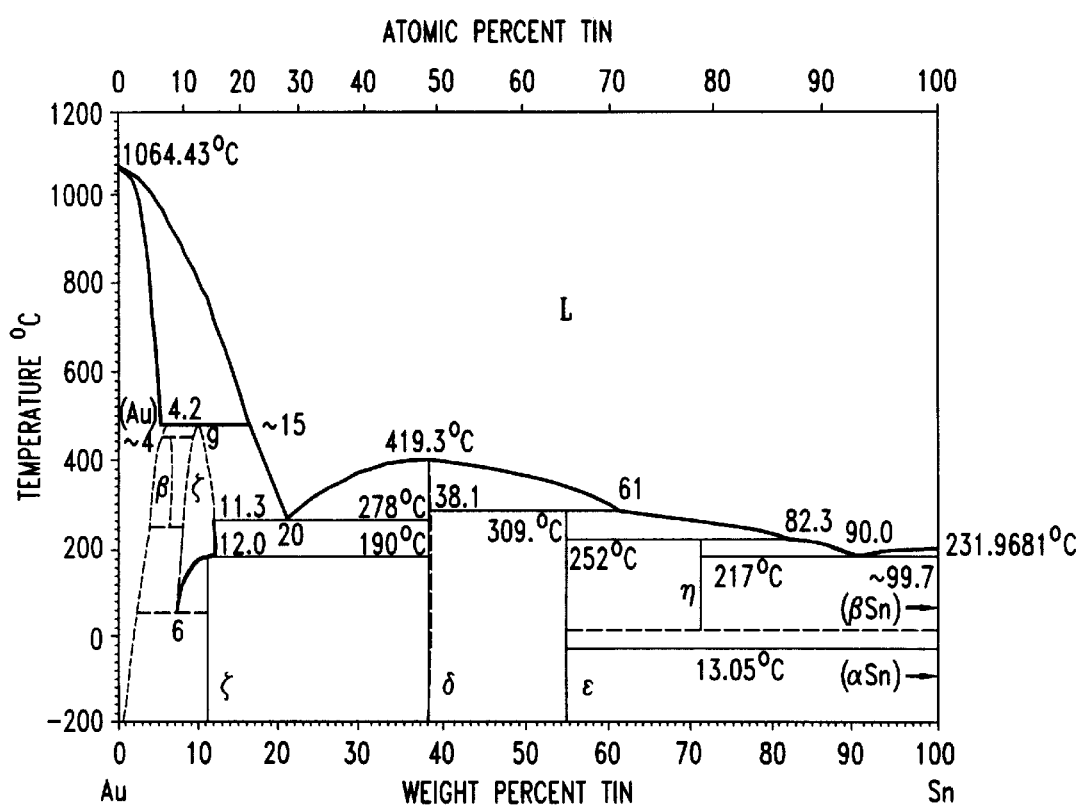
FIG. 1 is the phase diagram of the binary Au—Sn system.
Figure 2A:
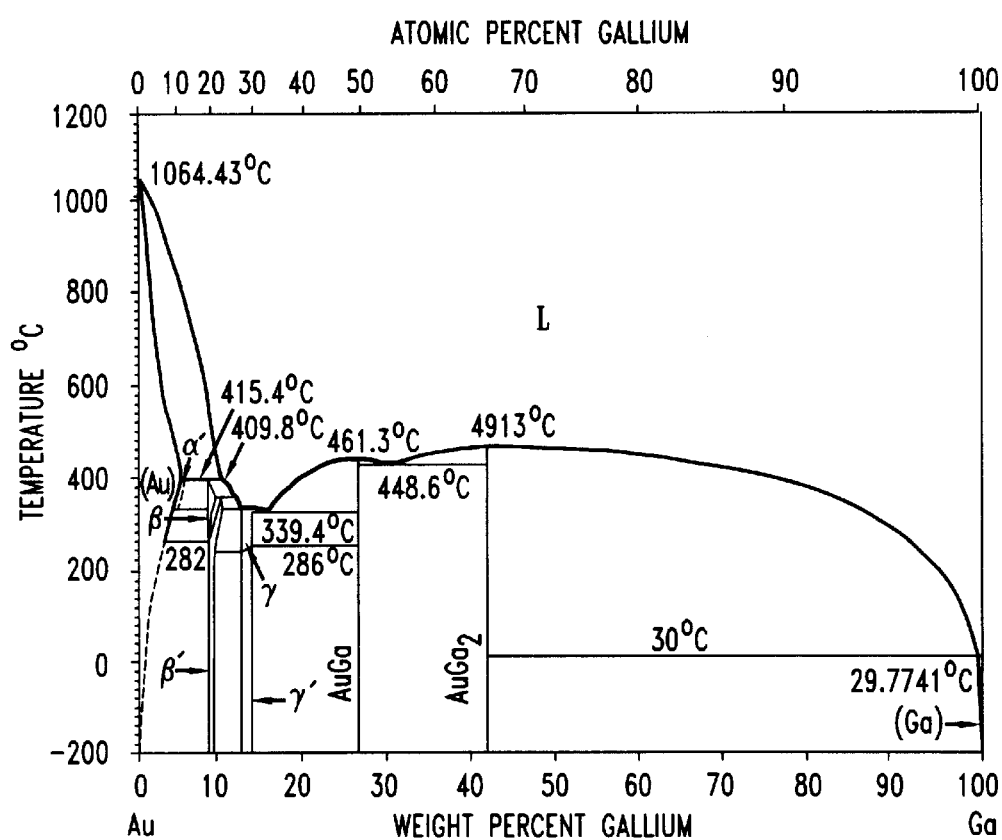
FIGS. 2A and 2B are the phase diagrams of the binary Au—Ga and Sn—Ga systems, respectively.
Figure 2B:
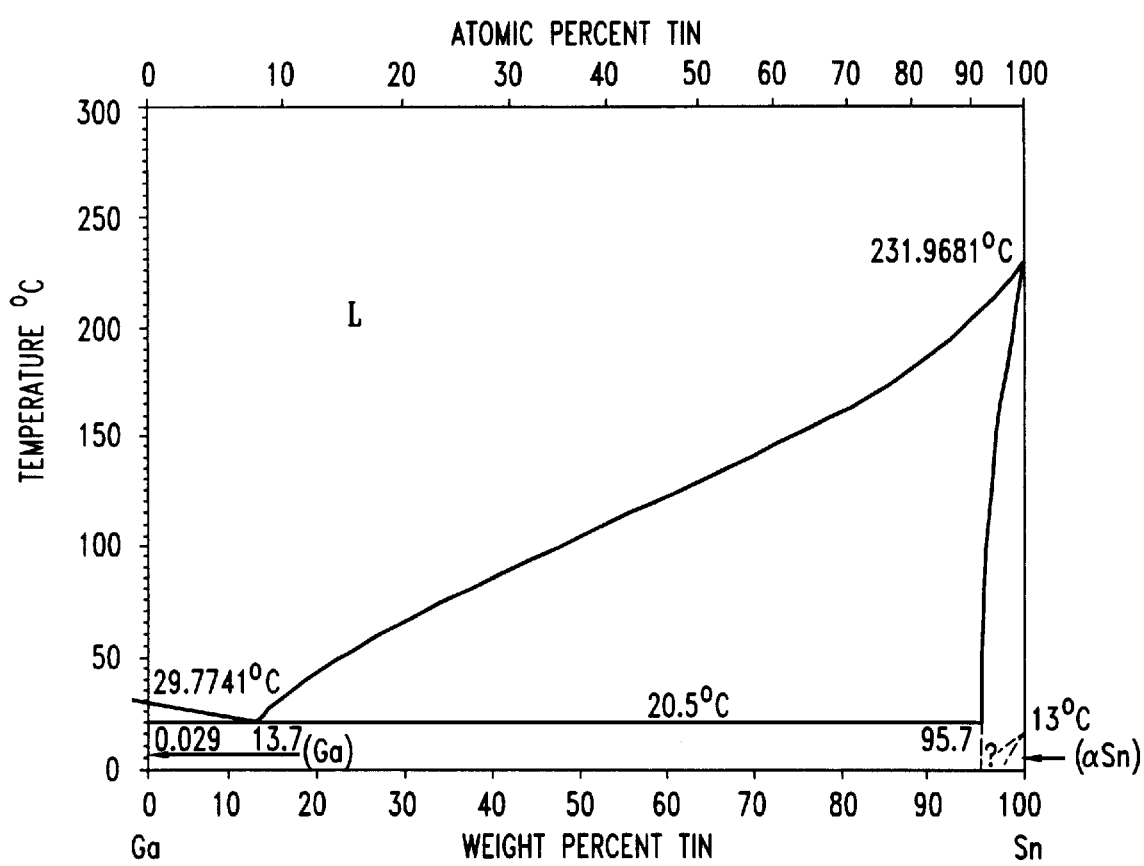

In most solder bonding operations, the components being joined exhibit different coefficients of thermal expansion. For example, in the case of a gold wire bonded to a silicon chip with a gold-tin eutectic solder, the coefficients of thermal expansion (CTE) of the gold wire, the silicon chip and the solder are 14 ppm/° C., 2.5–4 ppm/° C. and 15.8 ppm/° C. respectively. Typically, these thermal mismatches result in a locked-in residual stress in the solder joint upon cooling from reflow temperatures. For applications where one or more of the bonded components are sensitive to applied stresses (e.g., polarization maintaining fiber), the solder material desirably is able to undergo some stress-relaxation to relieve any residual stress, e.g., the solder advantageously has a relatively low creep resistance that allows such relaxation to occur. However, for applications requiring dimensional stability, e.g., in an opto-electronic package with a fiber soldered in alignment with a laser, it is desirable that the solder material have a high creep resistance under operating conditions to prevent any deformation that might affect alignment.

Because both creep and stress relaxation are thermally-activated phenomena caused by mechanisms such as bulk, grain boundary, or surface/interface diffusion of atoms, and/or the movement of dislocations within the material, dual requirements of high creep-resistance and high stress-relaxation tend to be mutually conflicting. For example, it is known that the creep resistance of materials generally corresponds to melting temperatures—i.e., the greater the melting temperature of a material, the greater its creep resistance. However, the higher the melting temperature of a solder, the greater is the temperature range through which the joint is cooled after the soldering operation, and, consequently, the greater the residual stress produced by thermal expansion mismatches. To obtain creep-resistant solder joints with low residual stresses, it is generally necessary to have a solder composition with both a relatively low melting point (to reduce the size of the temperature range through which the solder must pass upon cooling) and relatively high creep resistance in service. (A lower melting point also minimizes damage to components during the bonding process.) The solder used according to the invention meets these dual requirements.

The invention involves use of a solder composition containing 82 to 85 wt. % Au, 12 to 14 wt. % Sn, and 3 to 4 wt. % Ga, optionally with up to 2 wt. % additional elements such as Cu, In, Bi, Ag, Pb, Sb, or Ni, to tailor mechanical, thermal, corrosion, wetting, or other properties to specific applications. (Optionally, the solder contains only Au, Sn, and Ga, with unavoidable impurities.) Ga exhibits unique properties such as low melting point (29.76° C.), low vapor pressure even at high temperatures, and high resistance to attack by acids. These characteristics allow a small amount of added Ga to induce a significant depression in the liquidus temperatures of both Au and Sn, and thus a depressed melting point (at least 10° C. less, and typically about 27° C. less, than eutectic Au—Sn solder). The Ga also provides enhanced temperature-sensitivity of the solder's creep resistance.

The microstructure of the alloy contains two main phases—a substantially continuous Au-rich phase containing primarily Au and Ga, and a substantially discontinuous Sn-rich phase containing primarily Au and Sn. Typically, the substantially continuous Au-rich phase contains 55 to 95 wt. % of the Au present in the entire alloy, advantageously 60 to 90 wt. %, and at least 70 wt. % of the Ga present in the alloy, advantageously at least 85 wt. %. The effect of Ga on the melting point depression of Au is more pronounced than the effect of Sn, and it is therefore useful to have these amounts of Ga in the Au-rich phase. This distribution of Ga is also expected to reduce the ability of the Ga to lower the creep resistance of the alloy—specifically, because the discontinuous phase contains little Ga, the phase's creep resistance is only slightly lowered by the Ga. The discontinuous phase is therefore able to provide some dispersion-strengthening of the continuous phase. This feature is believed to allow the solder material to retain its creep resistance up to higher temperatures than would be attainable for a homogeneously-distributed Ga addition.

The Ga addition meets the conflicting demands of high creep-resistance and stress-relaxation of solder joints in the following manner. At typical operating temperatures, generally below a temperature of 170 to 230° C., more typically below a temperature of 180 to 200° C. the Au—Sn—Ga solder exhibits a creep strain 5 to 50% lower than 80 wt. % Au—20 wt % Sn. This high creep resistance thereby maintains desirable component alignment under typical operating conditions. At higher temperatures at which reflow and initial cooling from reflow occur, the solder exhibits a creep strain 10 to 50% greater than 80wt. % Au—20 wt. % Sn, and this lower creep resistance allows for relaxation of stresses during cooling of the solder from reflow temperatures. The resultant solder joint thereby encounters less stress, and is also able to sufficiently maintain the alignment of optical components.

In particular, the solder is useful in fabricating solder joints with lower residual stresses, reduced by at least 5%, advantageously at least 25%, at 20 to 80° C., compared to an 80 wt. % Au—20 wt. % Sn solder (as measured by X-ray diffraction or by monitoring the polarization effects in a PMF). Also, the solder typically exhibits at least 10% more creep resistance, advantageously at least 30% more, at 20 to 80° C., compared to an 80 wt. % Au—20 wt. % Sn solder. The solder typically exhibits desirable mechanical properties under operating conditions, e.g., a creep strain rate less than 10% a year, advantageously less than 1% per year, at this same temperature range of 20 to 80° C.

The high-temperature creep properties of the solder are best used by holding a solder joint containing the solder at an elevated temperature at which accelerated creep occurs, thereby reducing stresses, and then operating the device at lower temperatures at which higher creep-resistance than conventional Au—Sn solder is exhibited. For example, after forming the joint, it is possible to anneal the joined components at a temperature of 170 to 240° C., for 1 minute to 100 hours, more typically 10 minutes to 10 hours, to reduce the stresses in the joint. Such an anneal is generally performed such that stresses in the joint are reduced 2 to 25%. The anneal will generally reduce stresses by at least 5% more than an identical anneal performed on a joint formed from eutectic Au—Sn solder.

It is possible to prepare the solder by conventional alloying techniques. The resultant solder is used in the same manner as conventional solders, e.g., the solder joints of the inventive solder are formed by any of a variety of soldering techniques, including reflow soldering, wave-soldering, laser soldering, infrared soldering and hand soldering in the presence of suitable fluxes (paste fluxes such as rosin fluxes or gaseous fluxes such as formic acid entrained in inert gases, e.g. $N_2$) or in inert or reducing atmospheres. Soldering flux is typically not required, but is useful in reducing the oxidation of the molten solder, especially in air.

It is possible to produce solder joints according to the invention using a solder paste technique as well as solder bumps. Such solder pastes include the solder material mixed with suitable fluxes and other chemicals. It is possible to form such solder pastes on a component for producing solder joints using conventional techniques employed with surface mount components, including screen printing of the solder paste. After the paste is formed on a component, a mating component is properly aligned and positioned in contact with the solder paste, and a corresponding solder joint is formed by heating the components to reflow the solder. A variety of articles are capable of being formed according to the invention, e.g. laser source modules, undersea laser repeaters, optical fiber grating devices including Bragg gratings, long period gratings, and diffraction gratings. As noted above, the solder is particularly useful for applications requiring polarization maintaining fiber and other components sensitive to applied stresses.

Figure 3:
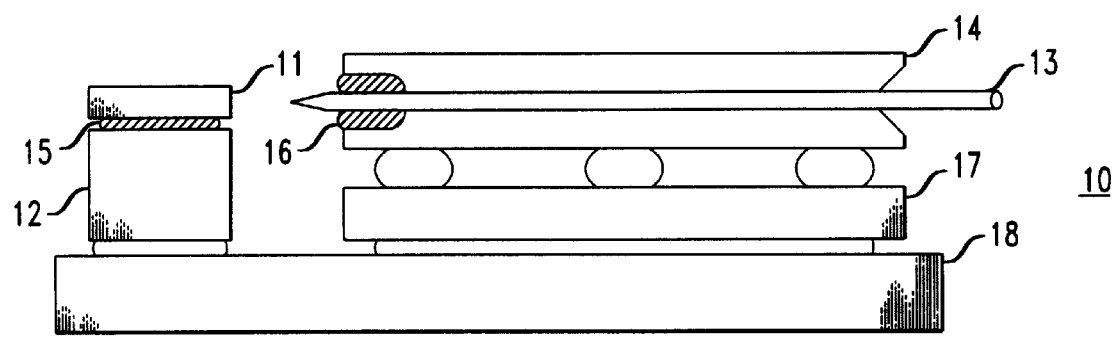
FIG. 3 is a schematic diagram of an optical communication device containing Au—Sn—Ga solder, according to an aspect of the invention.

An example of an opto-electronic telecommunication device 10 capable of fabrication according to an aspect of the invention is shown in FIG. 3. Solder joints 15,16 that secure a laser 11 and a polarization maintaining optical fiber 13 are formed from Au—Sn—Ga solder as described above. The laser 11 is mounted on a heat spreader 12, such as BeO, diamond, or SiC, for thermal management, while the fiber 13 is placed in a tube-shape sleeve 14, made of a material such as Kovar (an Fe—Ni—Co alloy). The sleeve 14 is mounted on a stand-off 17 and a substrate 18. Instead of mounting on a flat substrate, it is possible for the opto-electronic assembly to be made using a co-axial arrangement of the laser and the optical fiber.

Figure 4:
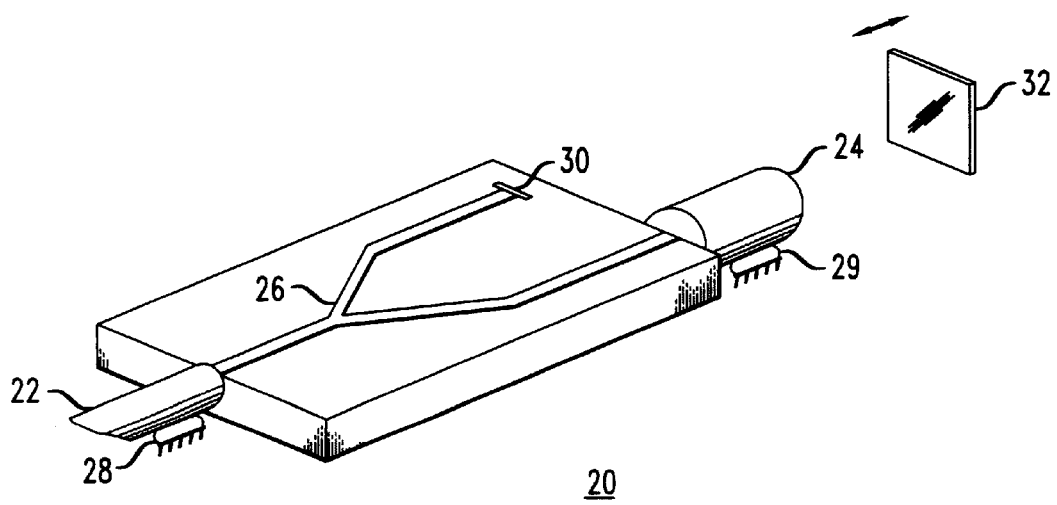
FIG. 4 is a schematic diagram of a sensor device containing Au—Sn—Ga solder, according to an aspect of the invention.

FIG. 4 shows a sensor device 20 having a polarization maintaining fiber 22 and a lens 24 held in alignment with respect to a waveguide 26 by low-stress bonds 28, 29 formed from Au—Sn—Ga solder as described above. The sensor 20 is an integrated optic microdisplacement sensor that uses the phase difference between the optical path lengths of the light reflected from the grooved mirror 30 (reference beam) and the moving mirror 32 (signal beam) to detect very small changes in position of the moving mirror 32. (See H. Hosokawa et al., "Integrated Optic Microdisplacement Sensor Using a Y-Junction and a Polarization Maintaining Fiber", Technical Digest, Optical Fiber Sensors Topical Meeting, Optical Society of America, p. 137 (1988).)

A variety of other electronic, opto-electronic and optical device structures are capable of being formed using the solder according to the invention. For example, in addition to bonding of optical fibers, bonding of a variety of other components such as planar waveguides (typically silica or phosphate glass), optical lenses, and heat-spreaders such as BeO (used in laser packages) are possible, generally with a suitable metallization scheme, e.g., Ti/Pt/Au or Cr/Cu/Au.

The invention will be further clarified by the following examples, which are intended to be exemplary.

EXAMPLE 1

A solder was made by melting 1.67 g of Au, 0.261 g of Sn (about 13% by weight of the alloy) and 0.072 g of Ga (about 3.6% by weight) inside a ¼ inch diameter quartz ($SiO_2$) tube. One end of the tube was sealed while the other was attached to a mechanical vacuum pump to create a vacuum to prevent oxidation of the solder during the alloying process. Heating was accomplished using a small gas torch. The solder was held molten at a temperature of ~400° C. for 5 minutes, with intermittent agitation to allow sufficient time for inter-mixing of the constituents and homogenization of the composition. On cooling and solidification, a homogeneous pellet of the inventive solder was obtained.

Figure 5A:
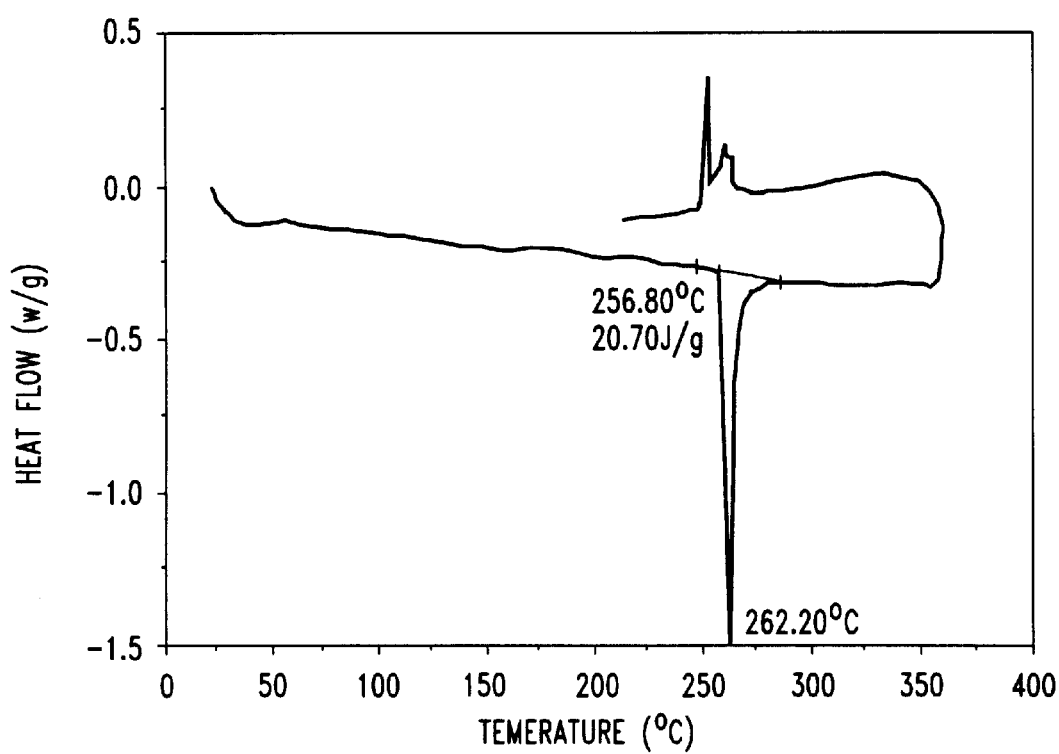
FIGS. 5A and 5B show differential scanning calorimeter (DSC) scans performed on Au—Sn—Ga solder and a standard 80wt. % Au—20 wt. % Sn eutectic solder.
Figure 5B:
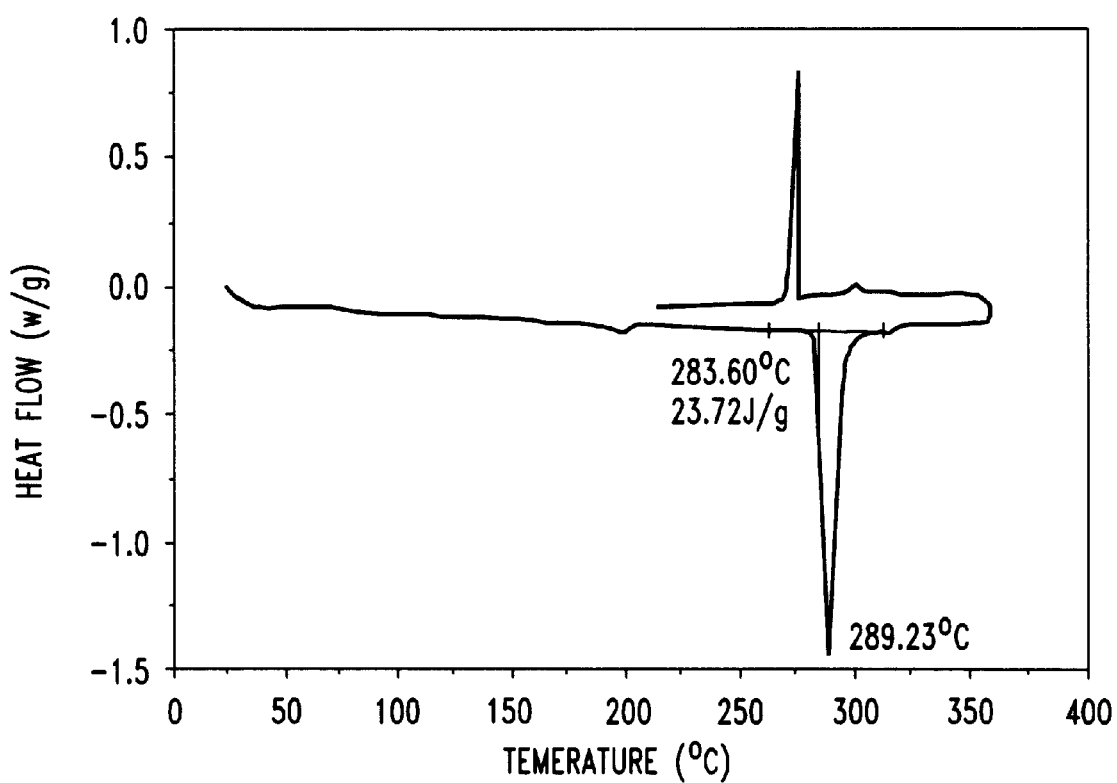

Differential Scanning Calorimeter (DSC) scans were performed on the Au—Sn—Ga solder (FIG. 5A) and a standard 80 wt. % Au—20 wt. % Sn eutectic solder (FIG. 5B), under similar conditions, to compare their melting temperatures. As seen from FIGS. 5A and 5B, the Au—Sn—Ga solder melts at a temperature that is about 27° C. below the melting point of the eutectic 80 wt. % Au—20 wt % Sn solder.

Scanning electron micrograph analysis of the Au—Sn—Ga solder shows that the microstructure consists mainly of two phases, as discussed earlier—a substantially continuous Au-rich phase made up predominantly of Au and Ga and a substantially discontinuous phase made up of Au and Sn, as confirmed by energy dispersive X-ray (EDX).

EXAMPLE 2

Figure 6B:
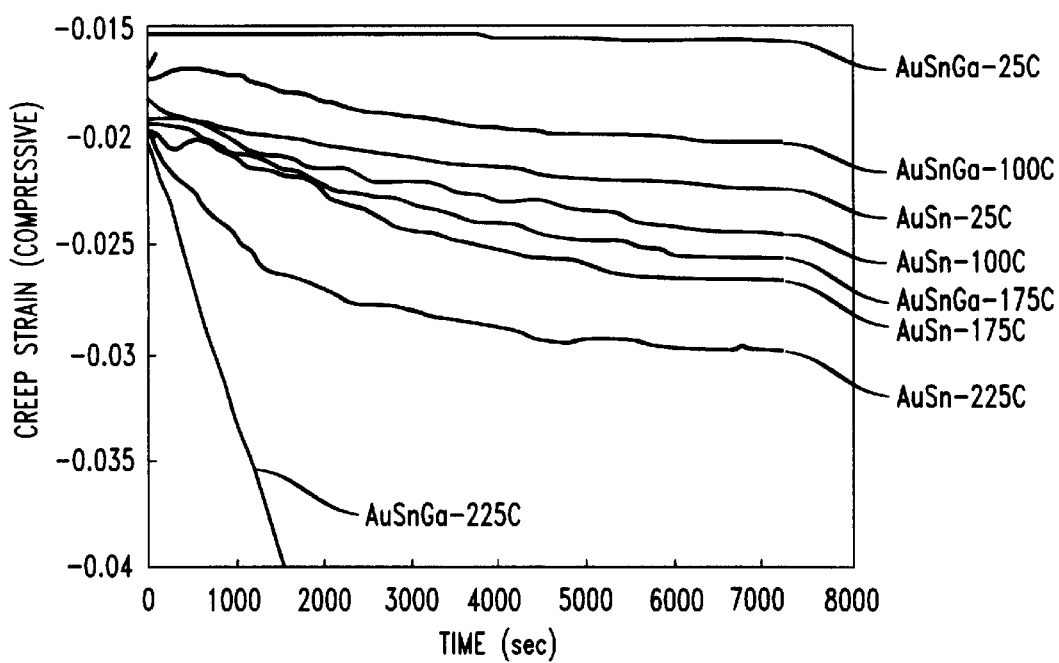

Cylindrical specimens for creep tests were made using an upcasting technique. The Au—Sn—Ga solder prepared in Example 1 was re-melted in a ¼ inch diameter quartz tube under an argon atmosphere, with an oxy-flame torch. The molten solder was then sucked up into a 1 mm inner diameter quartz capillary (which served as a mold) and allowed to cool. Upon solidification, cylindrical rods of the solder were obtained by sliding them out from the capillary. 2 mm long test specimens were cut from this rod and their ends polished to ensure that the flat faces were parallel and smooth. For comparison, specimens of the 80 wt. % Au—20 wt. % eutectic solder were also prepared under the same conditions. Creep tests were run at temperatures from 25° C.–225° C. with an applied compressive stress of 390 psi, using a dynamic mechanical analyzer equipped with a forced dry air convection oven. FIGS. 6A and 6B show the comparative creep strain vs. time plots for the Au—Sn—Ga solder and the eutectic Au—Sn solder, with FIG. 7B showing the data on a small creep strain scale. For temperatures of 175° C. and less, the Au—Sn—Ga solder showed a lower creep strain, at all times, than the Au—Sn eutectic solder. By contrast, at 225° C., the Au—Sn—Ga solder showed a substantially higher creep strain, at all times, than the Au—Sn solder.

Other embodiments of the invention will be apparent to those skilled in the art from consideration of the specification and practice of the invention disclosed herein.

What is claimed is:

1. An article comprising a solder composition consisting of 82 to 85 wt. % Au, 12 to 14 wt. % Sn, 3 to 4 wt. % Ga, and up to 2 wt. % additional elements.

2. The article of claim 1, wherein the article comprises a solder joint comprising the solder composition, and wherein the solder joint exhibits at least 5% less residual stress and at least 10% more creep resistance at 20 to 80° C. than an equivalent joint formed from an 80 wt. % Au—20 wt. % Sn solder composition.

3. The article of claim 2, wherein the solder joint exhibits at least 25% less residual stress and at least 30% more creep resistance at 20 to 80° C. than an equivalent joint formed from an 80 wt. % Au—20 wt. % Sn solder composition.

4. The article of claim 1, wherein the solder composition exhibits a creep strain rate of less than 10% per year at temperatures of 20 to 80° C.

5. The article of claim 4, wherein the creep strain rate is less than 1% per year.

6. The article of claim 1, wherein the solder composition exhibits a melting point at least 10° C. lower than an 80 wt. % Au—20 wt. % Sn solder composition.

7. The article of claim 1, wherein the solder composition exhibits a creep strain 5 to 50% less than an 80 wt. % Au—20 wt. % Sn solder composition below a temperature T, and wherein the solder composition exhibits a creep strain 10 to 50% greater than an 80 wt. % Au—20 wt. % Sn solder composition at temperatures above T, where T is 170 to 230° C.

8. The article of claim 6, wherein T is 180 to 200° C.

9. The article of claim 1, wherein the solder composition comprises a substantially continuous phase comprising at least 55 wt. % of the Au present in the solder composition, and a substantially discontinuous phase.

10. The article of claim 9, wherein the substantially continuous phase comprises at least 70 wt. % of the Ga present in the solder composition.

11. The article of claim 10, wherein the substantially continuous phase comprises at least 60 wt. % of the Au present in the solder composition and at least 85 wt. % of the Ga present in the solder composition.

12. The article of claim 1, wherein the article comprises a polarization maintaining fiber assembly.

13. The article of claim 1, wherein the solder composition consists of 82 to 85 wt. % Au, 12 to 14 wt. % Sn, 3 to 4 wt. % Ga, and unavoidable impurities.

14. A process for forming an article, comprising the step of joining at least two components by forming a solder joint comprising a solder consisting of 82 to 85 wt. % Au, 12 to 14 wt. % Sn, 3 to 4 wt. % Ga, and up to 2 wt. % additional elements.

15. The process of claim 14, further comprising the step of annealing the formed solder joint at a temperature of 170 to 240° C., such that stress in the joint is reduced 2 to 25%.

* * * * *